United States Patent [19]

Takahashi

[11] 4,216,517
[45] Aug. 5, 1980

[54] PROTECTION CIRCUIT FOR POWER AMPLIFIER

[75] Inventor: Shinobu Takahashi, Tokyo, Japan

[73] Assignee: Sansui Electric Co., Ltd., Tokyo, Japan

[21] Appl. No.: 906,759

[22] Filed: May 17, 1978

[30] Foreign Application Priority Data

May 25, 1977 [JP] Japan .............................. 52-67239[U]

[51] Int. Cl.$^2$ .............................................. H02H 7/20
[52] U.S. Cl. ........................................ 361/79; 361/92; 330/207 P
[58] Field of Search ....................... 361/79, 18, 92, 98, 361/88–90; 323/9, 22 T; 330/207 P

[56] References Cited

U.S. PATENT DOCUMENTS

| | | | |
|---|---|---|---|
| 3,102,241 | 8/1963 | Johnstone | 330/207 P |
| 3,536,958 | 10/1970 | Sondermeyer | 361/79 |
| 3,577,035 | 5/1971 | Constable | 361/79 |
| 3,691,427 | 9/1972 | Honda et al. | 330/207 P X |
| 3,898,532 | 8/1975 | Frank | 330/207 P X |
| 3,992,678 | 11/1976 | Suzuki | 361/98 X |

Primary Examiner—Patrick R. Salce
Attorney, Agent, or Firm—Harris, Kern, Wallen & Tinsley

[57] ABSTRACT

Disclosed herein is a protection circuit for a power amplifier. The protection circuit comprises a current detecting section for detecting a level of a load current of the power amplifier, a voltage detecting section for detecting a level of a load voltage across a load, an AND-gate circuit responsive to outputs of the current detecting section and the voltage detecting section for detecting a short-circuit of the load, and a control section responsive to an output of the AND-gate circuit for disconnecting the load from the amplifier.

6 Claims, 2 Drawing Figures

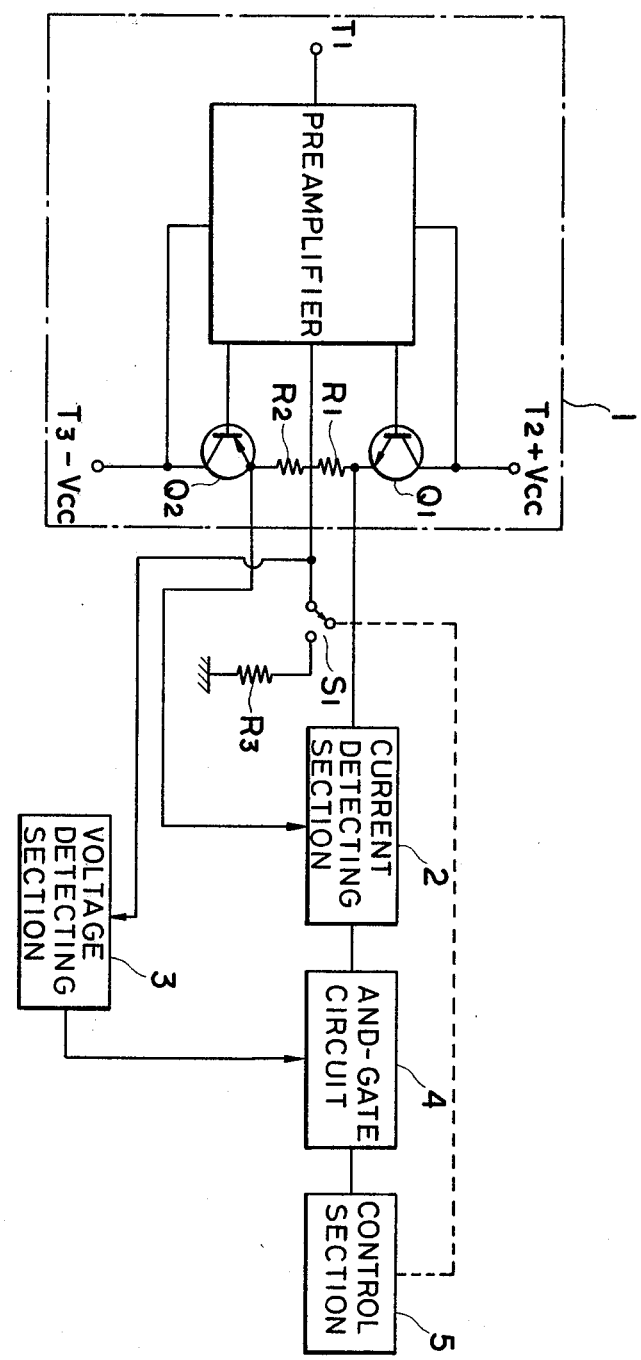
F I G. 1

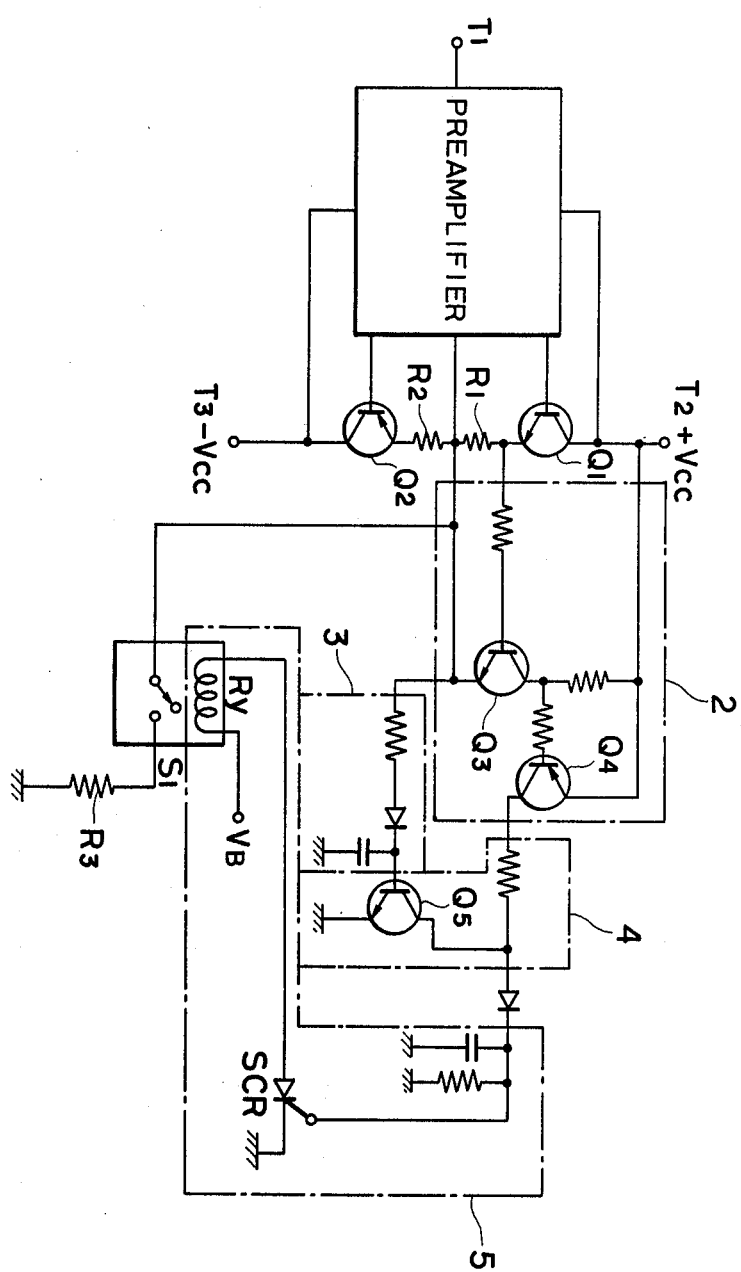
F I G. 2

PROTECTION CIRCUIT FOR POWER AMPLIFIER

BACKGROUND OF THE INVENTION

This invention relates to a protection circuit for a power amplifier which, when a load of the power amplifier is short-circuited, disconnects the load from the power amplifier.

In general, a protection circuit for a power amplifier aims at protecting the latter from over-current, over-voltage, over-heating, load-short-circuit, etc.

A protection circuit for a power amplifier has been proposed, wherein when its load is short-circuited, a short-circuit current is detected, upon which the protection circuit operates. In this circuit, however, since a current to be detected is derived from an output of the power amplifier, a threshold level of current to determine whether or not the load is short-circuited must be set at considerably high value comparing with the maximum load current at the maximum output of the amplifier. Accordingly, when the load is short-circuited, the protection circuit is operated after the current flowing through the load reaches at a level higher than the maximum load current, causing transistors or other circuit elements in the power amplifier to be damaged.

SUMMARY OF THE INVENTION

Accordingly, an object of the present invention is to eliminate the above described problem inherent to the prior art and to provide a more efficient protection circuit for a power amplifier.

The foregoing object is achieved by providing an improved protection circuit in which a load voltage and an output current of the amplifier are detected so that when the load voltage drops below a predetermined level while the load current flows, the load is disconnected from the power amplifier.

BRIEF DESCRIPTION OF THE DRAWINGS

FIG. 1 is a block diagram showing an embodiment of the present invention, and

FIG. 2 is an example of concrete circuit diagrams of the embodiment in FIG. 1.

DETAILED DESCRIPTION OF THE PREFERRED EMBODIMENT

In FIG. 1 which shows a block diagram of a power amplifier equiped with a protection circuit according to the present invention, a power amplifier 1 may be any of the conventional amplifier. In this embodiment, the power amplifier 1 comprises a preamplifier Pr having a signal input terminal $T_1$, a push-pull amplifier including an NPN transistor $Q_1$ and a PNP transistor $Q_2$ connected in complementary symmetry, emitter resistors $R_1$ and $R_2$ connected in series between the emitters of the transistors $Q_1$ and $Q_2$, and power supply terminals $T_2$ and $T_3$ to which supply voltages $+V_{cc}$ and $-V_{cc}$ are applied, respectively. A load resistor $R_3$ which is connected through a load disconnecting switch $S_1$ to the junction between the emitter resistors $R_1$ and $R_2$, represents a loudspeaker, for instance.

The protection circuit includes a current detecting section 2, a voltage detecting section 3, an AND-gate circuit 4, and a control section 5.

The current detecting section 2 has inputs connected to the emitters of the transistors $Q_1$ and $Q_2$, respectively, to compare a level of a load current flowing through the load resistor $R_3$ with a predetermined level and provides a low output when the load current is below the predetermined level and, otherwise, a high output. The predetermined level is set at a considerably small value comparing with the threshold level of current employed in the conventional protection circuit.

The voltage detecting section 3 is connected to the load resistor $R_3$ to detect a load voltage developed across the load resistor $R_3$. The voltage detecting section 3 compares the load voltage level with a predetermined small level around zero voltage and provides a low output when the load voltage is below the predetermined level and, otherwise, a high output.

The AND-gate circuit 4 has two inputs connected to outputs of the current detecting section 2 and the voltage detecting section 3 to obtain a logical product of the outputs of the current detecting section 2 and voltage detecting section 3 and provides a high output only when the output of the current detecting section 2 is high and the output of the voltage detecting section 3 is low.

Furthermore, the control section 5 is responsive to the output of the AND-gate circuit 4 for controlling the load disconnecting switch $S_1$ so as to open the load disconnecting switch $S_1$ in response to the high output signal of the AND-gate circuit 4 and to close the switch $S_1$ in response to the low output signal of the AND-gate circuit 4.

In operation, when an input signal is applied to the input terminal $T_1$ of the power amplifier, it is amplified by the preamplifier Pr and then amplified by the push-pull amplifier to drive the load resistor $R_3$ such a loudspeaker. In this case, a load current depends upon the output of the power amplifier and a load voltage is developed, which are fed to the current detecting section 2 and the voltage detecting section 3, respectively. Indicated in the following Table 1 are the output conditions of the current detecting section 2, the voltage detecting section 3, and the AND-gate circuit 4, and the state of the load disconnecting switch $S_1$, with various levels of input signal to the amplifier 1.

Table 1

| | input signal level | current detecting section 2 output | voltage detecting section 3 output | AND-gate circuit 4 output | load disconnecting switch $S_1$ |
|---|---|---|---|---|---|
| | signal zero | LOW | LOW | LOW | ON |
| Normal operation | signal small | LOW | LOW | LOW | ON |
| period of the load | signal middle | HIGH | HIGH | LOW | ON |
| | signal large | HIGH | HIGH | LOW | ON |
| | signal zero | LOW | LOW | LOW | ON |
| A load is | signal small | LOW | LOW | LOW | ON |
| short-circuited | signal middle | HIGH | LOW | HIGH | OFF |
| | signal large | HIGH | LOW | HIGH | OFF |

As is clear from the above Table 1, only when the load current flows while the load voltage drops below the predetermined level, the load disconnecting switch $S_1$ is turned off, causing the load $R_3$ to be disconnected from the amplifier 1. Accordingly, there is no need of setting the threshold current level as higher than the maximum amplifier output for disconnecting the load from the power amplifier 1.

A concrete example of the present invention is shown in FIG. 2 in which components identical to those in FIG. 1 are designated by the same reference numerals. In this concrete example, at a normal operation period of a load $R_3$, a transistor $Q_5$ of an AND-gate circuit 4, a base of which is connected to an output of a voltage detecting section 3, is rendered conductive. Under this condition, a current which is derived from an output of a current detecting section 2, flows in the path defined by the transistor $Q_5$ and the ground. On the contrary, when the load $R_3$ is short-circuited, the transistor $Q_5$ is turned to non-conductive state. Therefore, the current derived from the output of the current detecting section 2 flows toward a SCR to render it conductive, as a result of which a relay Ry is energized to open a load disconnecting switch $S_1$.

As is apparent from the above description, according to the present invention, when the load current of the power amplifier flows while the load voltage drops below the predetermined value, it is detected as the short-circuit of the load and the load is immediately disconnected from the power amplifier so that the power amplifier can be protected quickly and positively.

What is claimed is:

1. A protection circuit for a power amplifier having a load against a short-circuit of the load comprising:
   (a) a current detecting means for detecting a first level of a load current flowing through the load,
   (b) a voltage detecting means for detecting a second level of a voltage across the load,
   (c) a logic means responsive to outputs of said current detecting means and voltage detecting means to provide an output only when the load current flows above said first level while the load voltage drops below said second level,
   (d) a switch means operable to connect and disconnect said load to said amplifier, and
   (e) a control means responsive to the output of said logic means for controlling said switch means to disconnect the load from the amplifier.

2. A protection circuit as defined in claim 1, wherein said current detecting means compares the load current level with a predetermined level and provides an output to be supplied to said logic means.

3. A protection circuit as defined in claim 2, wherein said current detecting means provides a low output when the load current level is below the predetermined level and a high output when the load current level is above the predetermined level.

4. A protection circuit as defined in claim 1, wherein said voltage detecting means compares the load voltage level with a predetermined level and provides an output to be supplied to said logic means.

5. A protection circuit as defined in claim 4, wherein said voltage detecting means provides a low output when the load voltage level is below the predetermined level and a high output when the load voltage level is above the predetermined level.

6. A protection circuit as defined in claims 3 or 5, wherein said logic means provides a high output only when the output of said current detecting means is high and the output of said voltage detecting means is low, said high output being used to disconnect the load from the amplifier.

* * * * *